United States Patent [19]

Arndt

[11] Patent Number: 5,424,222

[45] Date of Patent: Jun. 13, 1995

[54] METHOD FOR MANUFACTURE OF A BLUE-SENSITIVE PHOTODETECTOR

[75] Inventor: Wolfgang Arndt, Heilbronn, Germany

[73] Assignee: Temic Telefunken microelectronic GmbH, Heilbronn, Germany

[21] Appl. No.: 196,565

[22] Filed: Feb. 15, 1994

[30] Foreign Application Priority Data

Mar. 3, 1993 [DE] Germany .................. 43 06 565.1

[51] Int. Cl.$^6$ ............................................. H01L 31/00
[52] U.S. Cl. ............................................. 437/3; 437/18
[58] Field of Search ............... 437/3, 37, 164, 950, 437/18; 198/DIG. 35; 136/255, 296

[56] References Cited

U.S. PATENT DOCUMENTS

| | | | |
|---|---|---|---|
| 3,607,449 | 9/1969 | Tokuyama | 437/164 |
| 3,849,204 | 11/1974 | Fowler | 437/18 |
| 4,011,016 | 5/1977 | Layne et al. | 357/195 |
| 4,577,393 | 3/1986 | Schmidt | 437/164 |
| 4,839,309 | 6/1989 | Easter et al. | 437/160 |
| 4,968,634 | 11/1990 | Kuhlmann | 437/3 |
| 5,141,895 | 8/1992 | Pfiester et al. | 437/950 |

FOREIGN PATENT DOCUMENTS

| | | |
|---|---|---|
| 0342391 | 11/1989 | European Pat. Off. . |
| 0387483 | 9/1990 | European Pat. Off. . |
| 140945 | 4/1980 | Germany . |
| 216141 | 11/1984 | Germany . |
| 3426226 | 1/1986 | Germany . |
| 3526337 | 2/1986 | Germany . |
| 3606557 | 9/1987 | Germany . |
| 3610157 | 10/1987 | Germany . |
| 3802365 | 1/1988 | Germany . |

OTHER PUBLICATIONS

J. Lindmayer et al.: "The violet cell: An improved silicon solar cell". Solar Cells, 29, 1990, pp. 151–166.
P. Glasow et al.: "SiC-UV-Photodetectors". SPIE, vol. 868, Optoelectronic Technologies for Remote Sensing from Space, 1987, pp. 40–45.
Mark Spitzer et al.: "High-Efficiency Ion-Implanted Silicon Solar Cells". IEEE Transactions on Electron Devices, vol. ED-31, No. 5, May 1984, pp. 546–550.
Y. H. Ku et al.: "Shallow, silicided p+/n junction formation and dopant diffusion in SiO2/TiSi2/Si structure". Appl. Phys. Letter 54 (17), Apr. 24, 1989, pp. 1684–1686.
N. N.: "Using Siliciees as a Diffusion Source". Semiconductor International, Jan. 1993, p. 26.
Souzw, IEE Transaction on electron devices, vol. 39, No. 1, Jan. 1992 pp. 166–175.

Primary Examiner—Olik Chaudhuri
Assistant Examiner—S. Mulpuri
Attorney, Agent, or Firm—Spencer, Frank & Schneider

[57] ABSTRACT

The method in accordance with the invention is characterized by the steps of before an ion implantation, a dielectric diffusing layer array is formed on a substrate that has at least one oxide layer and is thick enough for the maximum of implanted ions to be inside the layer array; and post-diffusion is implemented such that no further oxidation of the substrate is possible. By these measures, it is achieved that within the semiconductor substrate the doping continually decreases towards the pn-junction, apart from a very narrow segregation area, the result being an electrical field that conducts substantially all charge carriers generated in the area between the surface of the substrate and the pn-junction to this pn-junction. This achieves a quantum efficiency in the short-wave range that is considerably greater than that achievable with conventional photodetectors.

9 Claims, 3 Drawing Sheets

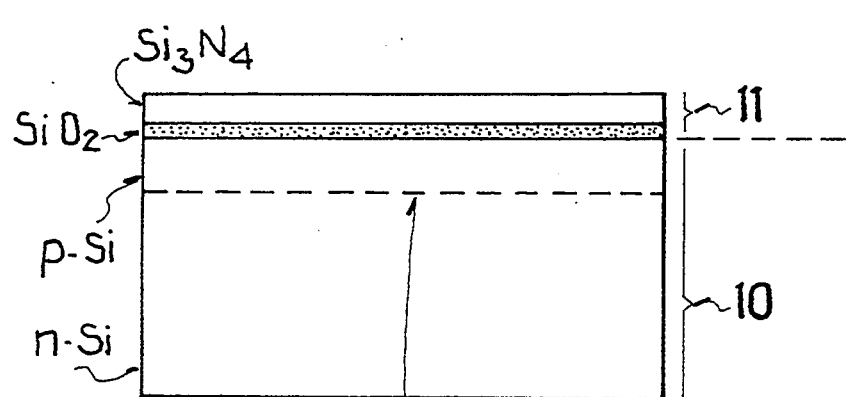
FIG. 1a
FIG. 1b
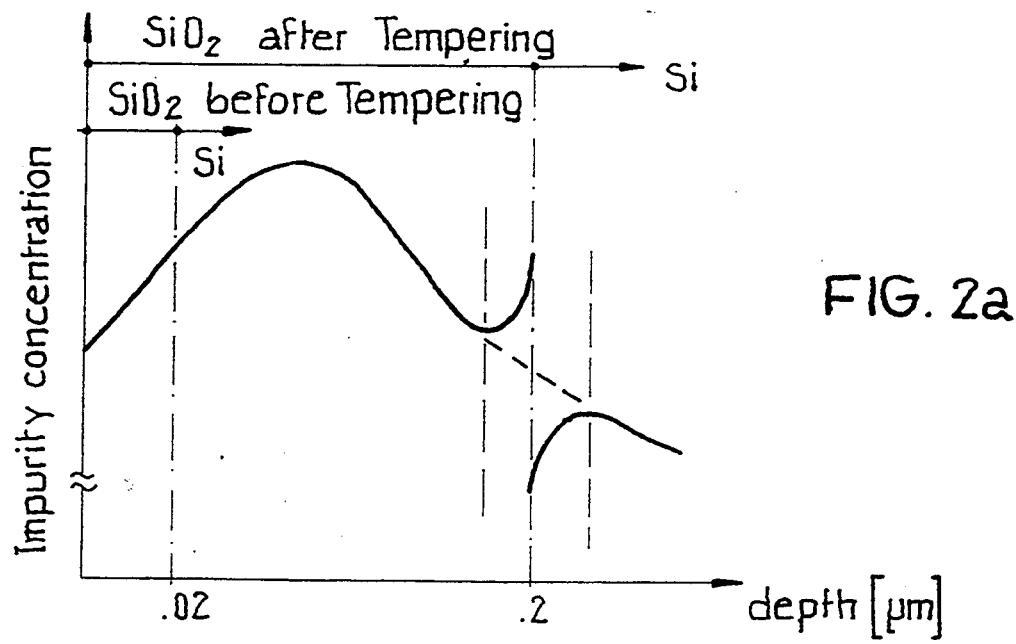
FIG. 2a
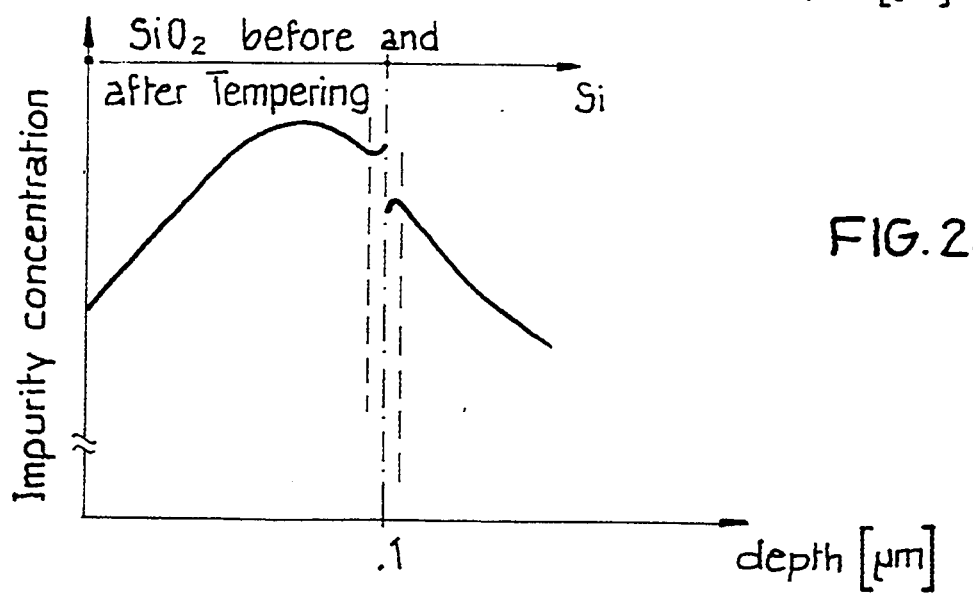
FIG. 2b

METHOD FOR MANUFACTURE OF A BLUE-SENSITIVE PHOTODETECTOR

BACKGROUND OF THE INVENTION

The following relates to a method for manufacture of a blue-sensitive photodetector, i.e. a photodetector which is sensitive in the range of blue visible light and the adjacent UV range up to a wavelength of 190 nm, after which the absorption of light starts.

PRIOR ART

A photodetector substantially comprises a semiconductor with a pn-junction. This semiconductor can be an element semiconductor, for example Si, or a compound semiconductor, for example InP. To achieve a high blue sensitivity, it is necessary that charge carriers, which are generated very close to the semiconductor surface, do not recombine at the surface, but reach the pn-junction. The pn-junction is therefore preferably just under the surface, i.e. a so-called flat pn-junction is used.

Flat pn-junctions are best obtained by implantation of ions, particularly heavy ions. To achieve p-conduction in an n-substrate, $B^+$ ions or $BF_2^+$ ions for example, are implanted at energies of a few tens of keV.

One problem in connection with ion implantation is however that the maximum dopant concentration is not on the surface of the substrate, but inside the latter. As a result, a concentration profile, and hence a profile of the electrical field, is generated that leads in the semiconductor area above the field maximum to the charge carriers generated during absorption of short-wave light drifting to the semiconductor surface and recombining there, without contributing to the photo current.

There are various possibilities for avoiding this drawback, which are described in EP-A-0 342 391.

One possibility is to implant through a diffusing layer known as screen layer, e.g. through a thin layer of the semiconductor substrate previously disordered by bombardment with non-doping ions, e.g. by bombardment of silicon with $Si^+$, or through a layer comprising an oxide or nitride. This measure is intended to ensure that the concentration increase of dopant is substantially inside the diffusing layer, so that charge carriers generated just below the semiconductor surface do not drift to the surface. It has however become clear that this object cannot be attained satisfactorily. In the enclosed FIG. 4, the dotted curve A shows the color a spectral response for an Si standard photodetector. As shown, there is no noteworthy response at a shorter wavelength than about 300 nm. The measure described does however avoid so-called channeling, i.e. increased implantation in privileged directions of the crystal lattice.

A second measure is to etch off the semiconductor after carrying out the ion implantation through a diffusing layer. This permits a shift of the maximum dopant concentration to the surface of the semiconductor and accordingly a very high quantum efficiency. The etching stage is however complicated and hence expensive.

The problem was therefore to provide a simple-to-perform method for manufacture of a blue-sensitive photodetector.

SUMMARY OF THE INVENTION

The method in accordance with the invention for manufacture of a photodetector sensitive in the short-wave light range, in which a flat pn-junction is generated in a substrate by ion implantation, is characterized above all by the following steps:

before an ion implantation, a dielectric diffusing layer array is formed on a substrate that has at least one oxide layer and is thick enough for the maximum or peak concentration of implanted ions to be inside the layer array;

conductivity impurity ions are implanted through the diffusing layer array into the substrate; and post-diffusion is implemented such that no further oxidation of the substrate is possible.

By these measures, it is achieved that within the substrate the maximum dopant concentration is on the surface or—due to the so-called segregation effect—just below it. This concentration curve leads to a curve of the electrical field inside the substrate that substantially prevents the charge carriers generated by the light absorption from reaching the substrate surface and recombining there without contributing to the photo current.

The layer array described is preferably applied so that it not only leads to the stated concentration distribution, but at the same time also has the passivation properties and/or antireflection properties required. It is of particular advantage in cases where an Si substrate is used to manufacture the dielectric layer array as an $SiO_2$ layer and an $Si_3N_4$ layer above it.

BRIEF DESCRIPTION OF THE DRAWINGS

FIGS. 1a and 1b show a diagrammatic cross-section through a photodetector in accordance with the invention and an associated concentration profile;

FIGS. 2a and 2b show dopant profiles respectively for a known photodetector and for one in accordance with the invention;

DESCRIPTION OF THE PREFERRED EMBODIMENTS

Figure 3:
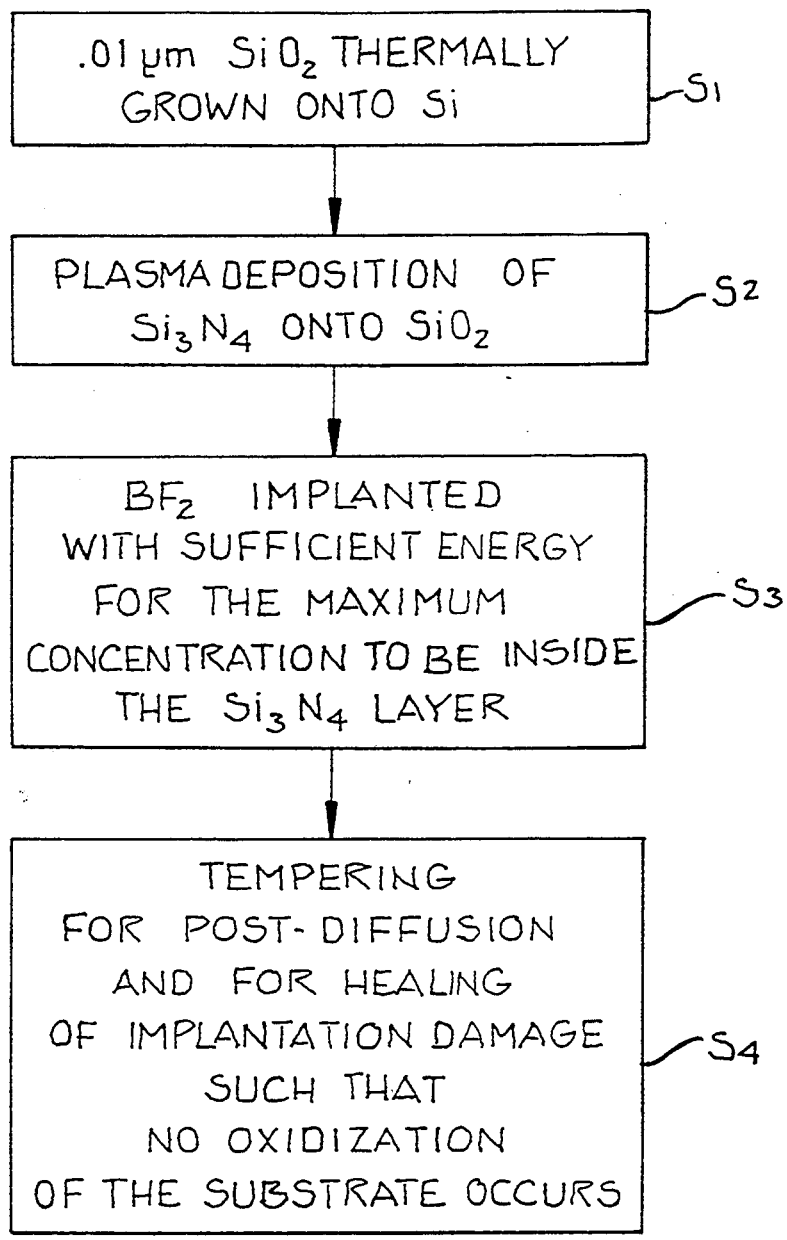
FIG. 3 shows a flow chart to illustrate a manufacturing method in accordance with the invention.

The invention is described in detail in the following on the basis of embodiments illustrated by figures.

FIG. 1a shows in diagrammatic form a photodetector with a substrate 10 and a dielectric layer array 11. These two portions are not drawn to scale, so that the dielectric layer array 11 can be discerned at all and the position of a pn-junction 12 inside the substrate 10 is discernible. The substrate 10 can have a thickness of several 100 μm. In the example illustrated, the substrate is n-Si, doped with boron in its surface area, thereby obtaining a p-conducting area. The pn-junction 12 is, for example, about 0.4 μm under the substrate surface. The dielectric layer array 11 has a total thickness of 0.1 μm, and comprises two partial layers, i.e. a lower $SiO_2$ layer with a thickness of 0.03 μm and an upper $Si_3N_4$ layer with a thickness of 0.07 μm.

FIG. 1b shows in graph form the curve of the boron ion concentration from the surface of the detector into its interior. FIG. 2b shows the dopant curve inside the dielectric layer array 11 more clearly, the latter consisting in this case however only of a $SiO_2$ layer. The concentration curve is not steady, since the segregation effect is encountered at the border between the $SiO_2$ layer and the Si substrate, by which effect boron atoms in the $SiO_2$ layer at the border with the substrate become enriched during thermal post-diffusion, while a very thin surface layer in the Si substrate is depleted of boron atoms. This segregation area is delimited in FIG. 2b by dotted lines. On account of the segregation effect, the boron atom concentration after post-diffusion is slightly higher at the border between the $SiO_2$ layer and the Si substrate than the maximum boron atom concentration inside the $SiO_2$ layer. Charge carriers generated by the absorption of short-wave light inside the segregation area in the Si substrate do not reach the pn-junction, but move to the substrate surface and recombine there without contributing to the photo current. By the method in accordance with the invention, however, an extremely closely limited segregation area is obtained, for which reason only a very small proportion of tile charge carriers is lost from drifting to the semiconductor surface.

FIG. 2a shows the same dopant profile, but for a known photodetector having a diffusion oxide layer of $SiO_2$ with a thickness of 0.02 $\mu$m grown after conventional post-diffusion in an oxidizing atmosphere up to a thickness of 0.2 $\mu$m.

During this oxidizing-type post-diffusion, the segregation area also widens considerably, which is crucial. This wide segregation area has the result that charge carriers generated by blue light or by light in nearby UV only reached the pn-junction to a small extent, since these charge carriers are predominantly generated just underneath the substrate surface, where the concentration curve according to FIG. 2a and hence the associated potential curve ensure that these charge carriers go to the semiconductor surface instead of to the pn-junction. This contrasts with the function as described above of the photodetector manufactured in accordance with the invention.

Figure 4:
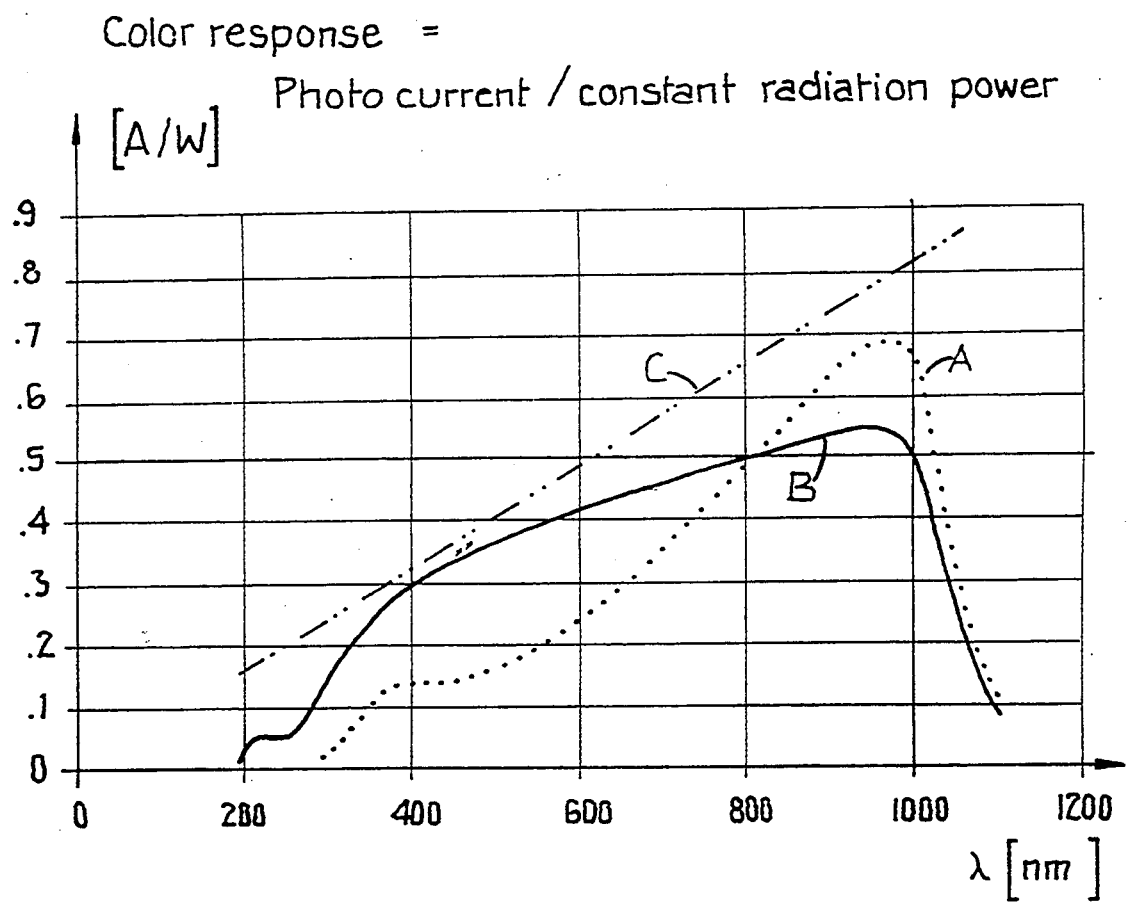
FIG. 4 shows a spectral response graph with a curve A shown as a dotted line for a known Si standard photodetector, and with a curve B shown as a continuous line for a photodetector in accordance with the invention and with a curve C shown as a dash-dot line for a reference curve with constant radiation power and 100% radiation efficiency.

The effects described above lead to an increase in the spectral response in the stated wavelength range, as is directly shown by comparison of curves A and B in FIG. 4. FIG. 4 also shows a straight dash-dot line indicating the photo current which would be achieved based on a constant radiation power, as a function of the wavelength of the irradiated light, if the quantum efficiency were to be 100%.

FIG. 3 shows a manufacturing method in accordance with the invention in the form of a flow chart. All method steps relating to the preparation of the substrate have been left out, as have all steps after the post-diffusion, e.g. steps for the application of electrodes.

In the flow chart in FIG. 3, it is assumed that an Si photodetector is manufactured. An $n^-$ substrate with a conductivity of 10 $\Omega$cm is assumed, corresponding to a phosphorus doping of $5 \times 10^{12}/cm^3$. On the substrate surface an $SiO_2$ layer with a thickness of 0.03 $\mu$m is grown thermally at about 950° C. in an $N_2O_2$ atmosphere. In a second step s2, an $Si_3N_4$ layer having a thickness of 0.07 $\mu$m is applied by chemical vapor deposition. To this end, the substrate is heated to about 800° C., and dichlorosilane ($SiCl_2H_2$) and $N_2$ are introduced at a pressure of about 4 mbars into an HF plasma chamber, where a reaction for the formation of $Si_3N_4$ takes place.

In a third step s3, $BF_2^+$ ions are implanted at 40 keV, leading to a maximum concentration at a depth of about 0.03 $\mu$m under the surface of the overall structure. Implantation continues until the required p-doping is achieved, e.g. of $10^{20}$. B/$cm^3$. Which penetration depths are achievable with which ions and at which acceleration energies may be found in standard works on ion implantation, for example the book "Ionenimplantation" by H. Ryssel et al., Teubner, Stuttgart 1978. The ions, the acceleration voltages and the layer thickness of the dielectric layer must be selected such that the maximum dopant concentration is inside the dielectric layer array.

In a method step s4, a tempering operation takes place to repair implantation damage, during which tempering operation post-diffusion too takes place, which causes among other things the aforementioned segregation effect. Substantial to this post-diffusion is that unlike conventional post-diffusion, it takes place such that the substrate does not oxidize further. This is achieved in the embodiment by the use of an $N_2$ atmosphere. However, a different non-oxidizing atmosphere may also be used, for example an Ar atmosphere. If operation is, in a conventional manner, in an oxidizing atmosphere ($O_2$, $N_2O_2$), the surface of the component must be protected against the penetration of oxygen, which can be achieved in particular with an $Si_3N_4$ layer.

Until a detector is completed, there are numerous further method steps (electrode manufacture, contacting, installation inside a housing), but which will not be discussed in detail here.

The combination as described above of an $SiO_2$ layer and an $Si_3N_4$ layer leads in a known manner to excellent passivation properties and at the same time to antireflection properties if the layer thicknesses are selected accordingly.

Individual layers or individual layer sequences of any material and layer thickness can be used as the dielectric layer array. The only important point is that the maximum dopant concentration after the ion implantation is inside the dielectric layer array and that this layer array does not become substantially thicker during post-diffusion, in order to avoid any increased segregation effect. Other properties of the dielectric layer array not connected with the doping curve and the segregation effect can be selected in any way required, i.e. to optimize the passivation and antireflection properties for example, as in the embodiment.

What is claimed is:

1. A method for manufacture of a photodetector which is sensitive in the short-wave light range in which a flat pn-junction is generated in a substrate by ion implantation, said method comprising:

covering a surface of said substrate of one conductivity type with a dielectric layer array having at least one oxide layer directly on the surface of said substrate;

implanting conductive impurity ions of the opposite conductivity type through said layer array into said substrate such that the peak concentration of the implanted ions is within said layer array; and subjecting the covered substrate with the implanted ions to a post-diffusion process at an elevated temperature and such that no further substantial oxidation of the substrate surface takes place.

2. A method according to claim 1, wherein the post-diffusion takes place in a non-oxidizing atmosphere.

3. A method according to claim 1, wherein prior to said post-diffusion step a passivation layer is formed over said oxide layer to prevent substantially the penetration of oxygen.

4. A method according to claim 1 wherein a sequence of partial layers of dielectric materials is used as said dielectric layer array, said partial layers being deposited with a thickness sufficient for the layer sequence to have an optimal antireflection effect in the spectral range of the light to be received.

5. A method according to claim 4 wherein the substrate is formed of Si and said layer array includes a layer of $Si_3N_4$ on a layer of $SiO_2$.

6. A method according to claim 1, wherein molecular ions are used as the conductive impurity ions.

7. A method according to claim 1 wherein said post-diffusion process is part of a tempering process to repair implantation damage to crystal structure.

8. A method according to claim 1 wherein the substrate is formed of Si and said layer array comprises a layer of $SiO_2$ as said one oxide layer and an overlying layer of $Si_3N_4$.

9. A method according to claim 8 wherein said peak concentration is within said $Si_3N_4$ layer.

* * * * *